United States Patent [19]

Giessen et al.

[11] Patent Number: 5,114,905

[45] Date of Patent: May 19, 1992

[54] CRYSTAL ALIGNMENT TECHNIQUE FOR SUPERCONDUCTORS

[75] Inventors: Bill C. Giessen, Cambridge; Robert S. Markiewicz, Lexington; Feng Chen, Boston, all of Mass.

[73] Assignee: Northeastern University, Boston, Mass.

[21] Appl. No.: 490,752

[22] Filed: Mar. 8, 1990

[51] Int. Cl.$^5$ .................. H01L 39/12; B06B 1/02
[52] U.S. Cl. ........................... 505/1; 264/22; 264/24; 264/56; 505/727
[58] Field of Search ............. 264/22, 56, 24; 505/1, 505/725, 727, 779

[56] References Cited

U.S. PATENT DOCUMENTS

| | | | |
|---|---|---|---|
| 4,288,398 | 9/1981 | Lemelson | 264/23 |
| 4,536,230 | 8/1985 | Landa et al. | 148/31.57 |
| 4,614,619 | 9/1986 | Shannon | 260/397.2 |
| 4,708,764 | 11/1987 | Boden et al. | 156/617 R |
| 4,765,055 | 8/1988 | Ozaki et al. | 29/599 |
| 4,775,576 | 10/1988 | Bouchand et al. | 428/216 |
| 4,798,765 | 1/1989 | Ishizaka et al. | 428/336 |
| 4,802,931 | 2/1989 | Croat | 148/302 |
| 4,806,176 | 2/1989 | Harase et al. | 148/111 |
| 4,818,500 | 4/1989 | Boden et al. | 422/249 |
| 4,842,704 | 6/1989 | Collins et al. | 204/192.24 |
| 4,842,708 | 6/1989 | Kadokura et al. | 204/298 |
| 4,853,660 | 8/1989 | Schloemann | 333/204 |
| 4,857,415 | 8/1989 | Tustison et al. | 428/620 |
| 4,859,410 | 8/1989 | Brewer et al. | 419/10 |
| 4,939,121 | 7/1990 | Rybka | 264/24 |

OTHER PUBLICATIONS

"Critical current enhancement in field-oriented YBa$_2$Cu$_3$O$_{7-\delta}$", K Chen et al, Appl. Phys. Lett. 55(3) Jul. 17, 1989, pp. 289–291.

"Ba$_2$YCu$_3$O$_{7-\delta}$ Crystal Surface Layers Orthorhombic Splitting, Dislocations, and Chemical Etching" D. J. Werder et al, Physica C 160 (1989) 411–416.

Primary Examiner—James Lowe
Assistant Examiner—Christopher A. Fiorilla
Attorney, Agent, or Firm—Weingarten, Schurgin, Gagnebin & Hayes

[57] ABSTRACT

A method of processing polycrystalline material by performing multi-axis crystal alignment utilizing anisotropies in the crystalline structure including the step of providing a polycrystalline material in a fluid suspension or malleable form having a magnetic moment. An external force to which the material is reactive is applied to align the individual crystals along a first axis. A magnetic field is applied to orient the magnetic moment of the crystals along a second axis, transverse to the first axis. The crystalline material may have a magnetic moment associated with a rare earth element of the material.

13 Claims, 4 Drawing Sheets

CENTRIFUGE

ELECTRIC FIELD (E)
(UNIFORM OR QUADRAPOLE)

CRYSTAL ALIGNMENT TECHNIQUE FOR SUPERCONDUCTORS

GOVERNMENTAL RIGHTS

The U.S. Government has a paid-up license in this invention and the right in limited circumstances to require the patent owner to license others on reasonable terms as provided for by the terms of contract No. SDI084-88-C-0049 awarded by the Office of the Secretary of Defense, Strategic Defense Initiative Organization.

FIELD OF THE INVENTION

This invention relates to the processing of polycrystalline materials and more particularly, to the processing of superconductor and other polycrystalline materials by performing multiaxis alignment of the individual crystalline grains utilizing anisotropies in the crystal structure.

BACKGROUND OF THE INVENTION

Proposed uses and advantages for high current, high transition temperature superconductors have not been realized, given that commercially usable superconductor materials in bulk form (including thick film) have to date been generally unavailable. Superconductor refers here and in the following description to the class of ceramic superconductors containing copper oxides or other oxides and having superconductivity transition temperatures ($T_c$) generally above the liquid nitrogen boiling temperature of 77° K. Critical currents of greater than $10^4$ A/cm$^2$ at magnetic fields of 10T are considered necessary for practical, current carrying applications. Although small amounts or segments of superconductor material with such an enhanced critical current carrying capability have been fabricated, no proven method exists for repeatably or controllably fabricating a bulk superconductor material with such high critical current carrying properties at operating temperatures of 77° K.

Previously, superconductors with high critical currents could be produced only in expitaxial thin films which are unsuitable for bulk current carrying applications, single crystals, which are too expensive and impractical for applications, or in thick films by a melt-textured growth process. Thick film superconductors however, cannot be made a practical thickness without loss of grain orientation.

The prior art has attempted to resolve this problem by aligning the crystals which form the superconductor material along one axis, which orients the crystals with their high-current carrying a-b planes (FIG. 1) in parallel and in the direction of preferred current flow as disclosed in U.S. Pat. No. 4,288,398 and U.S. Pat. No. 4,842,704. Single axis alignment has been achieved by making use of a single anisotropic property of the crystal such as shape, deformability or magnetic field orientation.

Although it has been shown that crystalline grains of superconductor material such as $YBa_2Cu_3O_{7-\delta}$(YBCO) can be aligned in a strong magnetic field such that the crystals magnetic moment lies along the field, it has been observed that for the YBCO compound, this alignment is along the c axis which is the same axial alignment as achieved by relying on other anisotropic properties of the crystal such as shape or plastic deformability. Although use of such a single anisotropy alignment results in some increase in critical current carrying capability, evidence has suggested that misorientation of the crystals within the conducting plane with respect to each other, that is the lack of alignment of these crystals with respect to a second crystal axis perpendicular to the first axis, results in reduced critical currents. See Critical Current Enhancement In Field Oriented $YBa_2Cu_3O_7$, Chen et al., Appl. Phys. Lett. 55(3), 17, July 1989. Accordingly, what is needed is a means for performing multi-axis alignment of the superconductor crystals utilizing two anisotropic properties of the crystals which are perpendicular to one another.

SUMMARY OF THE INVENTION

The present invention provides a method of fabricating superconductor and other crystalline materials by use of multiaxis alignment forces including a magnetic field. A first alignment force to which the crystals are reactive is provided to align the crystals along a first axis which serves to orient the crystals co-planar with one another, forming a joint conducting plane. This plane is chosen to be the plane permitting the highest critical currents in the material (high jc-plane). The crystals are also subjected to a magnetic field to further align the crystals along an axis which lies within the conducting plane and which is generally transverse to the first axis. The alignment of the crystals along the first axis is provided by one or more alignment forces appropriate to the particular material, and can include gravity, centrifugal force, deforming pressure or shear, or an electric field. For example, for a superconducting material having a shape anisotropy, the alignment along the first axis is by means of gravitational or centrifugal pressing, to mechanically urge the crystals into intended alignment; for a material having deformation anisotropy, alignment may be by use of a pressure, rolling or other shear deformation force; while for a superconducting material having an electrical anisotropy, alignment may be provided by an applied electric field.

The method of this invention includes the provision of crystals having one or more rare earth constituents added thereto. The one or more rare earth constituents added to the superconductor crystals serve to provide the crystals with a magnetic moment along a readily determinable axis which lies within the conducting plane and perpendicular to the first axis of alignment. The crystals are provided in a liquid suspension or in an otherwise fluent form, such as a semimolten, viscous, or powder form, which allow the crystals to move and orient themselves as a result of their anisotropic properties and responsiveness to applied alignment forces. An applied magnetic field is operative on the magnetic moment of the crystals to orient the crystals in relation to the applied magnetic field about an axis transverse to the first axis of alignment. The multiaxis alignment of the crystalline material is maintained as the material becomes fixed or static, so that in the fixed state, the crystals retain their multiaxis aligned condition.

The invention is described herein primarily with respect to superconductor materials. It is contemplated that the invention is also applicable to other crystalline materials where multiaxis alignment of crystals utilizing a magnetic field is desired to achieve intended material properties. For example, this invention is applicable to any material which has, or could be made to have, a magnetic moment along an axis generally perpendicular to a second axis along which a force appropriate to the particular anisotropic property of the material which is along the second axis, may be applied. For instance, many materials with strong magnetic properties (ferromagnets or antiferromagnets) are presently prepared using the prior art single axis alignment technology. Many other materials with anisotropic properties (ferroelectrics, piezoelectrics, quasi-one-dimensional conductors) would also benefit from post-preparation multi-axis orientation for fabrication.

BRIEF DESCRIPTION OF THE DRAWING

These and other features of the present invention will be better understood by reading the following detailed description taken together with the accompanying drawings, wherein.

DETAILED DESCRIPTION OF THE INVENTION

In accordance with the present invention, the processing of crystalline materials includes providing a crystalline material having a magnetic moment along an axis which lies within the conducting plane and allows the crystals to be aligned within the conducting plane by applying a magnetic field. The crystalline material is provided in a fluid or flowable or molten state which allows the crystals freedom of movement in response to applied external forces.

Figure 1:
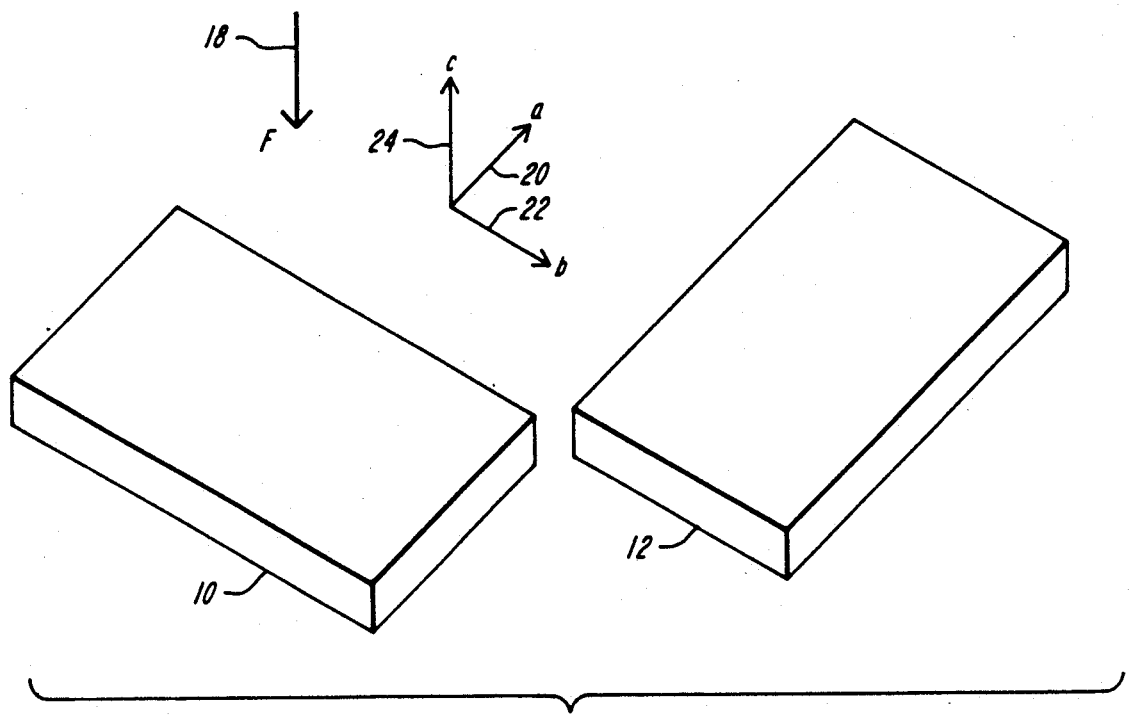
FIG. 1 is a schematic representation of two crystals which have been aligned by a force F along a single axis (c) as is known in the prior art.

As illustrated in FIG. 1, an external force F such as gravity, centrifugal force, pressure or electric field is applied to crystals 10 and 12 in the direction of arrow 18. This applied external force along the c axis 24 results in crystals 10 and 12 being aligned within the a-b plane defined by arrows 20 and 22. Although single axis alignment is known in the prior art, this technique does not allow for repeatable and controllable alignment of crystals 10 and 12 along an axis transverse to the c axis and which lies within the a-b conducting plane defined by arrows 20 and 22. Misorientation of crystals 10 and 12 within the a-b conducting plane results in reduced high critical current carrying capability in superconductor material and in general, provides a crystalline structure with partially uncontrolled grain orientation.

Figure 2:
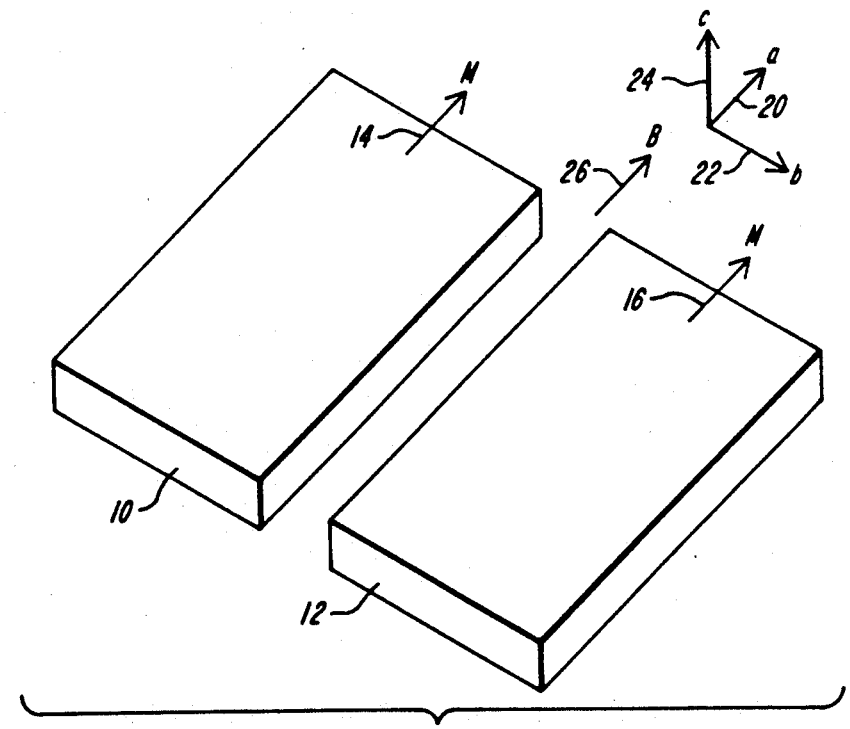
FIG. 2 is a schematic representation of the two crystals of FIG. 1 after their alignment about an axis (a) transverse to the first axis, using a magnetic field according to the present invention.

According to the present invention, crystals 10 and 12, FIG. 2, have magnetic moments M, indicated generally by arrows 14 and 16, which lie in the direction of the a axis 20 and which are a result of the addition of certain rare earth constituents to the superconductor material. A magnetic field B is applied, for example, in the direction of arrow 26. In response to the applied magnetic field 26, the magnetic moments 14 and 16 of crystals 10 and 12, align parallel to the applied magnetic field B, resulting in orientation of crystals 10 and 12 along a common, specific axis that lies within the conducting a-b plane defined by arrows 20 and 22, and which is transverse to c axis 24. For this illustration, the common axis along which the magnetic moments are oriented has been assumed to be the a axis. However, this is for illustration purposes only and different magnetic moment alignments within the a-b plane are possible, depending on the composition and treatment of the material.

Figure 3:
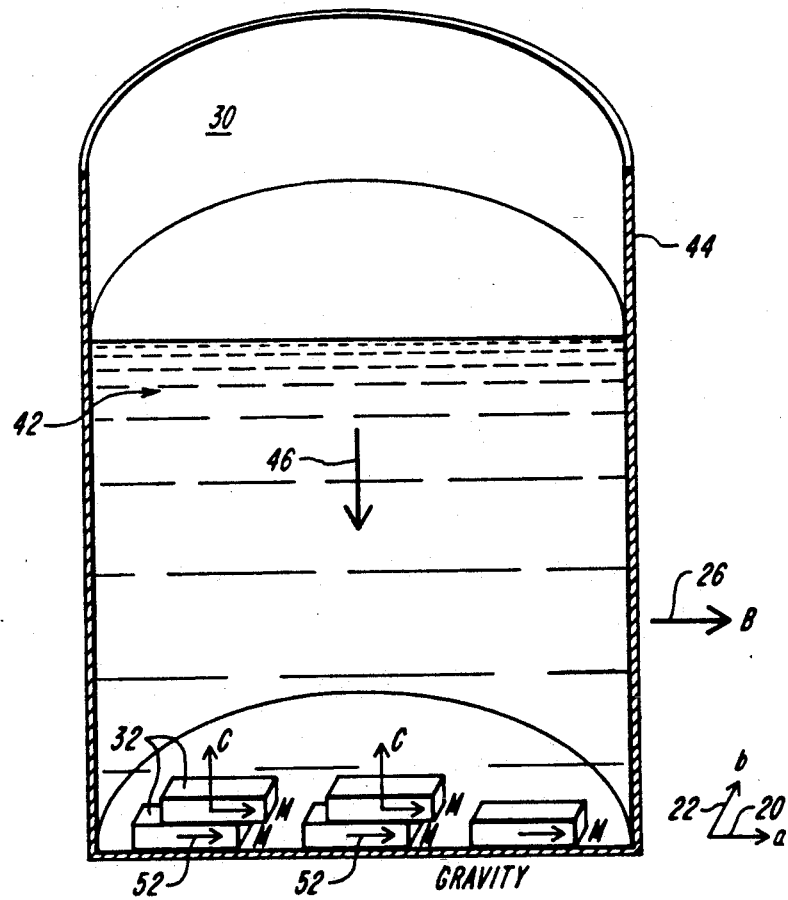
FIG. 3 is a diagram of a first embodiment of the method for performing crystal alignment according to the present invention utilizing the force of gravity to align the crystals along the first axis and a magnetic field to perform alignment about the transverse axis.

Although many techniques for processing crystalline material according to the present invention are possible and are considered to be within the scope of the present invention, only several of these are shown for illustrative purposes. By way of example, FIG. 3 shows a system 30 which includes a non-magnetic vessel 44 containing a suspension 42 of crystals 32. Suspension 42 containing crystals 32 is vigorously stirred and allowed to settle. Gravitational forces G in the vertical direction of arrow 46 serve to align crystals 32 along c axis 24.

Magnetic field B, in the direction of arrow 26 is also applied. Magnetic moments M of crystals 32, illustrated by arrow 52, are responsive to the magnetic field B to orient the crystals along an axis which lies within the a-b plane defined by arrows 20 and 22, and transverse to the axial alignment performed in response to the force of gravity. Multi-axis alignment of the crystals is maintained while the suspension is allowed to evaporate and the crystalline material consolidates or becomes fixed or static.

In a preferred embodiment, suspension 42 includes a carrier fluid such as chloroform to which has been added a deflocculent such as Triton ® (deoyl sarcosine) or a soap solution. The deflocculent comprises about two percent by weight of the suspension.

Superconductor crystals are typically ceramic cuprates and may include a bismuth compound superconductor material illustrated by the atomic formula $Bi_2Sr_2Ca_{1-x}RE_xCu_2O_y$ or the material $REBa_2Cu_3O_{7-\delta}$ or materials containing a combination of rare earths such as $(RE_{1,(1-x)}RE_{2,x})Ba_2Cu_3O_{7-\delta}$. The rare earth constituents (RE) may be selected from among those listed in FIG. 7 and preferably include Europium or Ytterbium. Oxide superconductor crystals with diameters in the range of 1–30 $\mu$m are provided. In addition, prior to adding the crystals to the suspension, the crystals may be etched to remove approximately 1 $\mu$m of the surface layer of the crystal to enhance intergrain coupling. The non-magnetic vessel 44 is, in the illustrated embodiment, a pressure cell die which is operative to form the crystals under pressure into a predetermined solid form such as a cylindrical pellet of approximately 1 cm diameter.

Although crystals 32 will respond to gravity G in the direction of arrow 46 given enough time, a source of ultrasonic energy may be utilized to speed the alignment of the crystals along the first axis.

Allowing a suitable period of time for the crystals to align along the first axis, a magnetic field B is applied. A magnetic field having a strength from 1 to 10 Tesla (T) applied for at least 1 minute has proved satisfactory. Finally, suspension 42 may be heated to accelerate evaporation. After the crystalline material has consolidated and has been shaped into its desired form, a sintering process may be used to further enhance the critical current of the superconductor material.

Although the technique for processing crystalline materials according to this invention is described in terms of applying a first force and then subsequently applying a magnetic field, it is understood that the forces may be applied in either order or simultaneously with one another.

Figure 4:
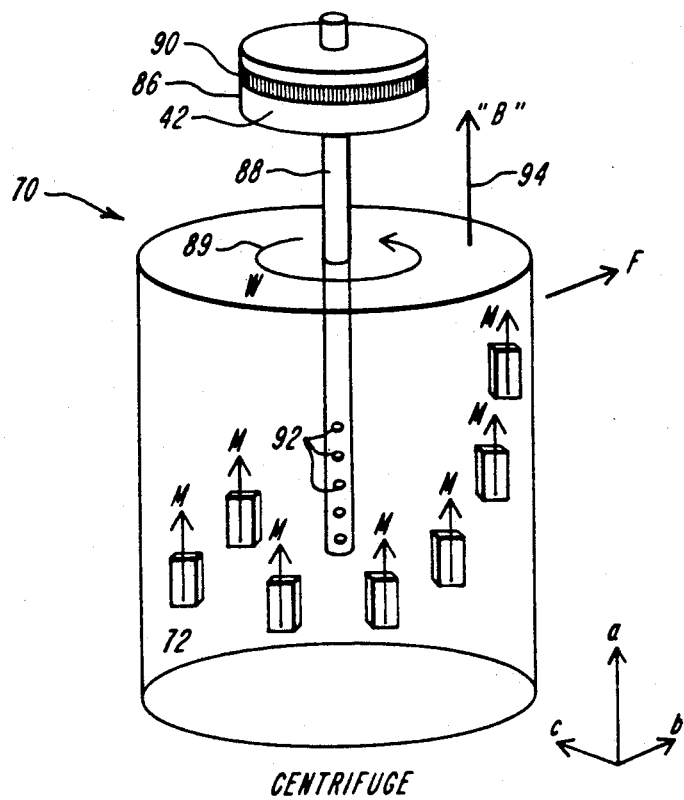
FIG. 4 is an additional embodiment of the method of the present invention utilizing centrifugal force to align the crystals along the first axis.

In a second embodiment of the crystal processing technique according to the present invention, centrifuge 70, FIG. 4, spinning in the direction of arrow 89 is utilized to align crystals 72 along a first axis shown as the c axis. Magnetic field B is also applied and serves to align the crystals along a second axis transverse to the c axis.

In accordance with this embodiment of the present invention, a suspension 42 of superconductor crystals and chloroform, in approximately 1:1 concentration, with the addition of a deflocculent, is poured into reservoir 86 for processing. As centrifuge 70 spins at approximately 1800 RPM in the direction of arrow 89, the suspension in reservoir 86 is delivered through feed tube 88 at a constant, predetermined rate by applying downward pressure through piston 90. The suspension exits feed tube 88 through holes 92 and crystals 72 align against the wall of the centrifuge along their c axis.

During delivery of the suspension into centrifuge 70, magnetic field B is applied in the direction of arrow 94. A magnetic field having a strength of 14 Tesla has proved satisfactory. The magnetic moment M of crystals 72 are responsive to the applied magnetic field B and orient the crystals along an axis transverse to the c axis, and within the a-b plane. As a result, multiaxis alignment of the crystals is achieved. The multiaxis alignment is maintained while the suspension evaporates and the crystalline material solidifies.

Figure 5:
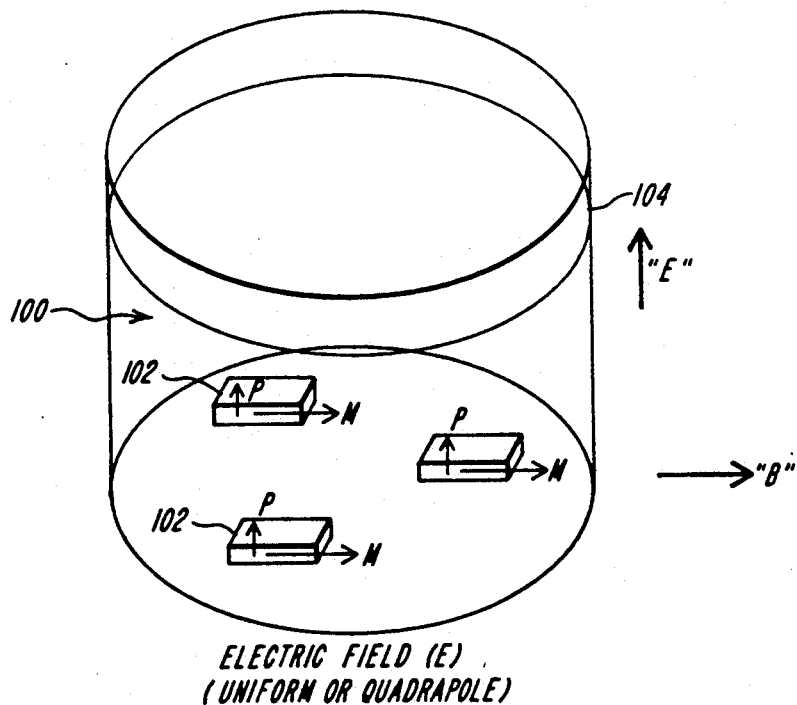
FIG. 5 is a diagram of an additional embodiment of the crystal alignment method according to the present invention, utilizing an electric field acting on the electrical anisotropy of the crystals to perform alignment along the first axis.

In the embodiment illustrated in FIG. 5, suspension 100 of crystals 102 is provided in a non-magnetic vessel 104. The electric dipole P of crystals 102 is responsive to an applied electric field E to align crystals 102 along an axis parallel to an axis defined by the dipole P of the crystals. The magnetic moments M of crystals 102 are responsive to an applied magnetic field B causing the crystals to rotate and align along an axis transverse to the first axis of alignment, thereby providing multiaxis alignment of the crystals. The multiaxis alignment is maintained while the suspension evaporates and the crystals form a solidified mass.

Figure 6:
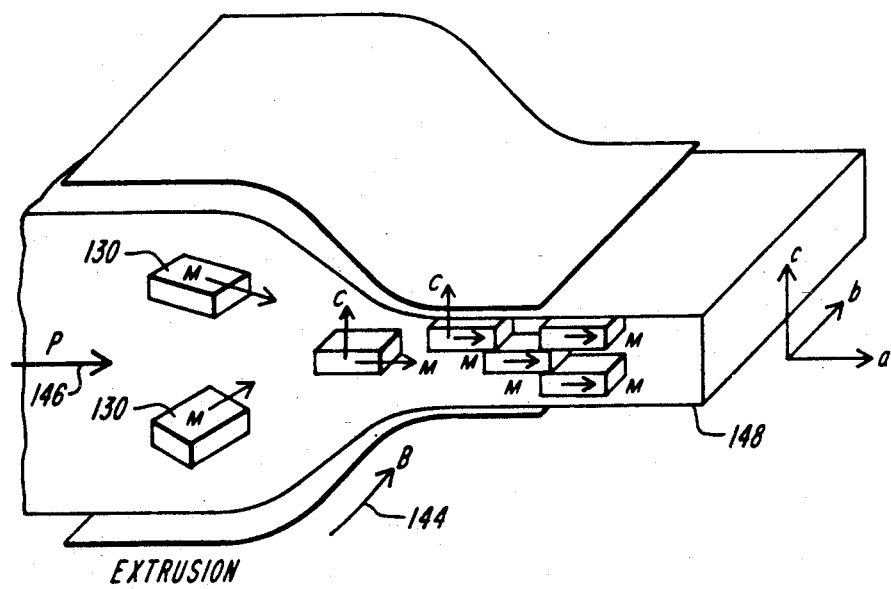
FIG. 6 is an additional embodiment of the crystal alignment technique of this invention utilizing an extrusion method relying on the formability anisotropy of the crystals to perform alignment along the first axis.

In another embodiment illustrated in FIG. 6, the crystalline material is in a semimolten or other malleable or deformable form inside a cladding 148. Prior to cladding and working the material, the crystals 130 have been aligned by a magnetic field B parallel to the direction 144 along an axis transverse to the rolling direction and also transverse to the intended direction of alignment by deformation, which is normal to the plane of the ribbon 148. This alignment is maintained while a pressure or deformation force P is exerted in the direction of arrow 146. Crystals 130 are responsive to the pressure or deformation force P and align along the c axis. As a result, a ribbon form 148 of multiaxis aligned crystalline material is provided in accord with the processing techniques of the present invention. In this embodiment, the malleable substance to which the crystals have been introduced includes a material such as a thickened suspension discussed in conjunction with FIG. 3 or a dried powder. The cladding material preferably includes silver. In addition, the pressure may be applied by extruding through a die or by rolling. The applied magnetic field B typically has a strength of approximately 1 to 14 Teslas as needed to provide a well aligned material prior to the deformation alignment shape.

The process of the instant invention is well suited for use in processing crystals of superconductor materials which have a magnetic moment enhanced by one or more rare earth constituents. Examples of suitable superconductor materials are illustrated by the atomic formulas $Bi_2Sr_2Ca_{1-x}RE_xCu_2O_y$, a (Bi-2212) type compound, $Pb_{0.25}TlBa_2Ca_{3-x}RE_xCu_4O_y$, (Tl-1234) type compound and $(M_{1-x}RE_x)Ba_2Cu_3O_{7-\delta}$, an (RE-123) compound. The rare earth constituents comprise an atomic percentage of the superconductor compound, as given by the values of x in these formulas, where $x = 0.05$ to 1.0 in the Bi and Tl compounds, with a preferred range of 0.1 to 0.3, and $x = 0.05$ to 1.0 in the RE-123 compound, with a preferred value of x approximately equal to 1.

Utilizing these compounds, various rare earth constituents have been added to the superconductor crystals and the degree of crystal alignment as a function of their magnetic moment and responsiveness to an applied magnetic field determined by means of x-ray diffraction. It has been discovered that certain crystals with various rare earth constituents have a higher degree or percentage of magnetic orientation within a specific crystal direction lying in the a-b plane than do others.

Figure 7:
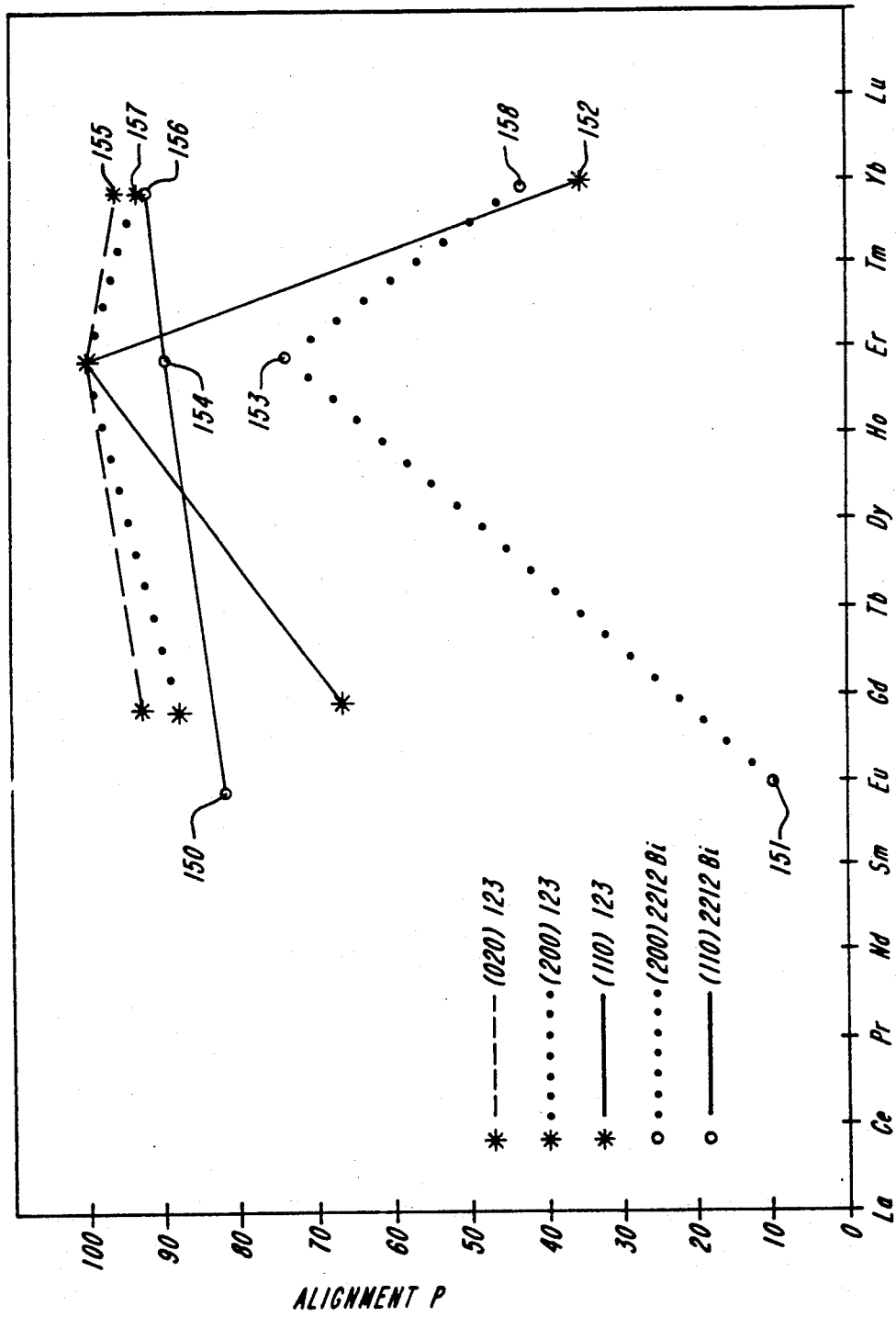
FIG. 7 is a graph showing the percentage and resulting directions of crystal orientation of various rare earth elements added to or present as a primary constituent to produce the magnetic moment of various crystalline materials according to the present invention.

For example, a large percentage (approximately 80%) of Bi-2212 crystals to which have been added the rare earth constituent Europium (Eu) tend to align along the crystal $<hh0>$ direction such as the $<110>$ direction, normal to the (110) plane, as illustrated by graph point 150, FIG. 7. A much smaller percentage, or only approximately 10%, of Bi-2212 crystals to which have been added Europium align along the crystal $<h00>$ direction such as the $<200>$ direction, normal to the (200) plane, as shown at point 151. In contrast, Bi-2212 crystals which have the rare earth element Erbium (Er) added to enhance their magnetic moment have no strong preferred crystal direction of alignment and consequently, during any given magnetic alignment procedure, a large percentage of the crystals may align along the crystal $<h00>$ direction as illustrated by point 153 on the graph, or the crystals may align along the crystal $<hh0>$ direction as shown by graph point 154. Since there is no strong preferential alignment direction for Bi-2212 crystals to which have been added the rare earth element Erbium, this combination is less satisfactory than other combinations.

Adding the rare earth constituent Ytterbium (Yb) to Bi-2212 crystals results in a very large percentage of the crystals aligning along the crystal $<hh0>$ direction as illustrated by graph point 156, whereas a much smaller percentage of the crystals tend to align along the crystal $<h00>$ direction as shown at graph point 158. Again, by contrast, RE-123 crystals a preferred direction of crystal alignment along the $<0h0>$ direction or the $<h00>$ direction as shown at graph points 155 and 157 respectively. In contrast, a much smaller percentage of RE-123 crystals with Ytterbium tend to align in the crystal <110> direction as shown at point 152. These anisotropies in the alignment behaviors of high $T_c$ superconductor oxides of these two types (Bi-2212 and RE-123) containing Europium and Ytterbium are extremely significant in enabling the methods of the subject invention to be implemented.

The possible use of Ytterbium in these materials is also significant because of the important economic consideration concerning the price of Ytterbium with respect to that of Europium.

Accordingly, superconductor compounds to which have been added appropriate rare earth constituents and having in combination, a high tendency for preferential crystal orientation, are preferred in order to ensure as complete a multiaxis alignment as possible. In addition, superconductor compounds with rare earth constituents which preferentially align either parallel or transverse to a particular crystalline axis may be chosen dependent upon the desired magnetic technique being utilized.

Modifications and substitutions of the present invention by one of ordinary skill in the art are considered to be within the scope of the present invention and within the claims which follow.

What is claimed is:

1. A method of performing multi-axis crystal alignment of ceramic cuprate superconductor material composed of a plurality of crystals having an a-b plane with high critical current carrying capability and a c-axis which is perpendicular to said a-b plane, and containing a rare earth element selected from the group consisting of Europium, Erbium and Ytterbium, comprising the steps of:

selecting at least one of said rare earth elements to be incorporated into said ceramic cuprate superconductor material, said crystals including a magnetic moment predictably oriented along a predetermined crystal axis which lies within the a-b plane and thereby lies perpendicular to the c-axis, said magnetic moment determined by said at least one selected rare earth element;

providing said superconductor material in a form in which said crystals may be re-oriented tin response to a plurality of applied forces;

applying a magnetic field along a first spatial direction to orient the magnetic moments of the crystals with said predetermined crystal axis lying in said a-b plane along said first spatial direction;

applying an external force which aligns the superconductor material such that the c-axis of the crystals are parallel and aligned along a second spatial direction which is perpendicular to said first spatial direction; and maintaining the alignment of the crystals along the first and second spatial directions while the crystals of said superconductor material become fixed.

2. The method of claim 1 wherein said crystals are suspended in a fluid.

3. The method of claim 2 wherein said fluid includes a deflocculant.

4. The method of claim 2 further including the step of facilitating evaporation of said fluid and fixation of said superconductor material.

5. The method of claim 4 wherein facilitating evaporation of said fluid includes the step of heating said fluid.

6. The method of claim 1 wherein the external force includes gravity wherein said external force is applied simultaneously with said magnetic field.

7. The method of claim 6 wherein said gravity force is enhanced by an ultrasonic energy force.

8. The method of claim 1 wherein said external force includes centrifugal force.

9. The method of claim 1 wherein applying said external force includes applying pressure on said superconductor material within a pressure cell die to form a superconductor structure having a predetermined shape.

10. The method of claim 9 further including the step of sintering said pressure formed superconductor structure.

11. The method of claim 9 in which said predetermined shape includes a cylindrical pellet shape.

12. The method of claim 1 wherein the step of applying an external force is performed prior to the step of applying a magnetic field.

13. The method of claim 1 wherein applying an external force includes applying a pressure or deformation force.

* * * * *

UNITED STATES PATENT AND TRADEMARK OFFICE
CERTIFICATE OF CORRECTION

PATENT NO. : 5,114,905
DATED : May 19, 1992
INVENTOR(S) : Bill C. Giessen, et al.

It is certified that error appears in the above—identified patent and that said Letters Patent is hereby corrected as shown below:

Column 4, line 45, "(deoyl sarcosine)" should read --(oleoyl sarcosine)--.

Column 6, line 20, "$(M_{1-x}RE_x)Ba_2Cu_3O_{7-\delta},)$" should read --$(M_{1-x}RE_x)Ba_2Cu_3O_{7-\delta}')$--.

Signed and Sealed this

Sixteenth Day of November, 1993

Attest:

BRUCE LEHMAN

Attesting Officer

Commissioner of Patents and Trademarks